(12) United States Patent
Ker et al.

(10) Patent No.: US 6,671,147 B2
(45) Date of Patent: Dec. 30, 2003

(54) DOUBLE-TRIGGERED ELECTROSTATIC DISCHARGE PROTECTION CIRCUIT

(75) Inventors: Ming-Dou Ker, Hsinchu (TW); Kei-Kang Hung, Changhua Hsien (TW); Shao-Chang Huang, Chia-Yi Hsien (TW)

(73) Assignee: United Microelectronics Corp., Hsinchu (TW)

( * ) Notice: Subject to any disclaimer, the term of this patent is extended or adjusted under 35 U.S.C. 154(b) by 404 days.

(21) Appl. No.: 09/872,180

(22) Filed: Jun. 1, 2001

(65) Prior Publication Data

US 2002/0154462 A1 Oct. 24, 2002

(30) Foreign Application Priority Data

Apr. 24, 2001 (TW) ........................................ 90109741 A

(51) Int. Cl.$^7$ ................................................. H02H 9/00
(52) U.S. Cl. ........................ 361/56; 257/369; 257/355; 361/111
(58) Field of Search ........................... 361/56, 111, 118, 361/58, 91.1; 257/369, 360, 355

(56) References Cited

U.S. PATENT DOCUMENTS

| 5,519,242 A | | 5/1996 | Avery |
| 5,543,650 A | * | 8/1996 | Au et al. ..................... 257/355 |
| 5,631,793 A | | 5/1997 | Ker et al. |
| 5,646,808 A | | 7/1997 | Nakayama |
| 5,811,857 A | | 9/1998 | Assaderaghi |
| 5,910,874 A | | 6/1999 | Iniewski |

OTHER PUBLICATIONS

Authors: Charvaka Duvvury and Carlos Diaz, Title of Article: Dynamic Gate Coupling of NMOS for Efficient Output ESD Protection, Date of Publication: Jan., 1992.

* cited by examiner

Primary Examiner—Stephen W. Jackson
Assistant Examiner—James A Demakis
(74) Attorney, Agent, or Firm—Charles C. H. Wu; Wu & Cheung, LLP

(57) ABSTRACT

A double-triggered electrostatic discharge (ESD) protection circuit for coupling with a first voltage source and a second voltage source. The circuit includes a diode series and a transistor. The diode series comprises a plurality of serially connected diodes with the cathode of one diode connected to the anode of a subsequent diode. The positive terminal of the first diode in the diode series connects with the first voltage source. The gate terminal of the transistor connects with the anode of the last diode in the diode series. The substrate of the transistor connects with the cathode of the last diode in the diode series. The source terminal and the drain terminal of the transistor connect with the first voltage source and the second voltage source, respectively. By using double-triggered design, the ESD clamp device can be quickly triggered on to bypass ESD current. Therefore, the ESD protection circuit has a better protection capability to protect the IC in deep-submicron CMOS technologies against ESD damage.

25 Claims, 7 Drawing Sheets

US 6,671,147 B2

DOUBLE-TRIGGERED ELECTROSTATIC DISCHARGE PROTECTION CIRCUIT

CROSS-REFERENCE TO RELATED APPLICATION

This application claims the priority benefit of Taiwan application serial no. 90109741, filed on Apr. 24, 2001.

BACKGROUND OF THE INVENTION

1. Field of Invention

The present invention relates to an electrostatic discharge protection circuit for an integrated circuit. More particularly, the present invention relates to a gate-driven and substrate-triggered electrostatic discharge protection circuit.

2. Description of Related Art

In general, an electrostatic discharge (ESD) through an integrated circuit IC may damage some of the internal semiconductor devices that the IC is no longer functional. ESD often produces a large current within a short transient interval that loading capacity of the semiconductor devices is exceeded.

To prevent damages to the IC, an on-chip ESD protection circuit is generally incorporated into an IC chip. The ESD protection circuit can be regarded as a type of switch that turns on when an ESD incidence is triggered by a voltage surge. The ESD current caused by the voltage surge is discharged through an alternative route instead of passing through the IC circuit. However, without any unusual voltage surge, the ESD protection circuit remains off so that normal operation of the IC circuit is unaffected.

The incorporation of an ESD protection circuit into a deep-submicron CMOS circuit is particularly difficult because the gate oxide layer is relatively thin in deep submicron fabrication. In addition, breakdown voltage of the gate oxide layer is relatively low, about 10V. Therefore, triggering voltage of the ESD protection circuit must be lowered to a level below the breakdown voltage of the gate oxide layer in order to provide an effective protection. In the following, a few conventional ESD protection circuits are introduced.

FIG. 1 is a first conventional ESD protection circuit disclosed in U.S. Pat. No. 5,910,874. The circuit has a gate-to-ground connecting configuration. As shown in FIG. 1, the gate terminal and the source terminal of a transistor M1 are both connected to a ground terminal. The drain terminal of the transistor M1 is connected to an input/output pad. This circuit utilizes junction avalanche breakdown of the transistor M1 to bypass any ESD current. The main disadvantage of this arrangement is that the avalanche breakdown voltage and the gate oxide layer breakdown voltage are very close and hence the gate oxide layer may be easily damaged.

FIG. 2 is a second conventional ESD protection circuit disclosed in U.S. Pat. No. 5,646,808. The circuit includes a pair of transistors 12 and 14. The drain terminal of the transistor 12 is connected to an input/output pad 16 and the gate terminal of the transistor 12 is connected to the drain terminal and the gate terminal of the transistor 14. The source terminals of transistors 12 and 14 are connected to a ground terminal. The gate control circuit (transistor 14) triggers the transistor 12 directly into a snapback region so that the triggering voltage is lower than a normal value. The main disadvantage of this invention is that the triggering voltage rises without falling if the voltage coupled to the gate of the transistor 12 having a certain high value. FIG. 3 is a graph showing the characteristic drain current $I_D$ versus drain voltage $V_D$ under various gate-to-source voltages $V_{GS}$.

FIG. 4 is a conventional gate-driven ESD protection circuit disclosed by U.S. Pat. No. 5,519,242. The gate control circuit includes a Zener diode 22 and a resistor 26. The cathode of the Zener diode is connected to a point along the conductive line joining the drain terminal D of an NMOS transistor 24 and a voltage source as well as an input/output pad. The anode of the Zener diode is connected to a point along the conductive line joining the gate terminal G of the NMOS transistor 24 and one end of the resistor 26. The other end of the resistor 26 is connected to the source terminal S of the transistor 24 as well as a voltage source VSS.

FIG. 5 is a conventional capacitor-coupled ESD protection circuit disclosed by U.S. Pat. No. 5,631,793. The circuit is inserted between an input pad 31 and an internal circuit 33. The circuit also has ESD bypass devices 323, 324 for carrying ESD current. The capacitor-coupled circuit is used for coupling a portion of the voltage to the ESD clamping device 323. By optimizing resistor parameters (Rp, Rn) 321 and capacitor parameters (Cp1, Cp2) 322, snapback breakdown voltage can be greatly lowered such that the thin gate oxide layer is well protected.

FIG. 6 is a conventional gate-body-coupled ESD protection circuit disclosed by U.S. Pat. No. 5,811,857. The main body (substrate) 428 and the gate terminal 422 of the MOSFET transistor are connected together to form a dynamic threshold voltage MOSFET device 42. The gate terminal of the device 42 is connected to a level shifting device 44. When voltage applied to the gate terminal 422 of the MOSFET and the main body 428 rises, threshold voltage of the MOSFET decreases correspondingly.

SUMMARY OF THE INVENTION

Accordingly, one object of the present invention is to provide a double-triggered electrostatic discharge (ESD) protection circuit. The circuit can be substrate-triggered and gate-driven so that the triggering voltage level is reduced and protection capacity provided by the ESD protection circuit is enhanced.

A second object of this invention is to provide a double-triggered ESD protection circuit. The ESD protection circuit is incorporated into a circuit chip for dealing with any static electricity buildup between an input/output pad and a voltage source ($V_{DD}$ or $V_{SS}$).

To achieve these and other advantages and in accordance with the purpose of the invention, as embodied and broadly described herein, the invention provides a double-triggered electrostatic discharge (ESD) protection circuit. The ESD protection circuit couples with a first voltage source and a second voltage source and includes a diode series and a transistor. The diode series comprises a plurality of serially connected diodes with the cathode of one diode connected to the anode of a subsequent diode. The positive terminal of the first diode in the diode series connects with the first voltage source. The gate terminal of the transistor connects with the anode of the last diode in the diode series. The substrate of the transistor connects with the cathode of the last diode in the diode series. The source terminal and the drain terminal of the transistor connect with the first voltage source and the second voltage source, respectively.

This invention also provides a second double-triggered electrostatic discharge (ESD) circuit coupled to an input/output pad, a voltage source (for example, for providing a relatively low voltage $V_{SS}$ to the circuit) and an internal circuit. The double-triggered ESD circuit includes a diode, a diode series and a transistor. The cathode of the diode is connected to the input/output pad and the anode is connected to the voltage source. The diode series comprises a plurality of serially connected diodes. The positive terminal of the first diode in the diode series is connected to the input/output pad. The gate terminal of the transistor is connected to the anode of the last diode of the diode series. The substrate of the transistor is connected to the cathode of the last diode in the diode series. The source terminal and the drain terminal of the transistor are connected to the input/output pad and the voltage source, respectively.

This invention also provides a third double-triggered electrostatic discharge (ESD) circuit coupled to an input/output pad, a voltage source (for example, for providing a relatively high voltage $V_{DD}$ to the circuit) and an internal circuit. The double-triggered ESD circuit includes a diode, a diode series and a transistor. The anode of the diode is connected to the input/output pad and the cathode is connected to the voltage source. The diode series comprises a plurality of serially connected diodes. The anode of the last diode of the diode series is connected to the input/output pad. The gate terminal of the transistor is connected to the anode of the first diode in the diode series. The substrate of the transistor is connected to the cathode of the first diode in the diode series. The source terminal and the drain terminal of the transistor are connected to the input/output pad and the voltage source, respectively.

This invention also provides a fourth double-triggered electrostatic discharge (ESD) circuit coupled to an input/output pad, a first voltage source (for example, for providing a relatively high voltage $V_{DD}$ to the circuit) and a second voltage source (for example, for providing a relatively low voltage $V_{SS}$ to the circuit). The double-triggered ESD circuit includes a first diode, a first diode series, a first transistor, a second diode, a second diode series, a second transistor, a third diode series and a third transistor. The anode of the first diode is connected to the input/output pad and the cathode of the first diode is connected to the first voltage source. The first diode series comprises a plurality of serially connected diodes. The cathode of the last diode in the first diode series is connected to the input/output pad. The gate terminal of the first transistor is connected to the cathode of the first diode in the first diode series. The substrate of the first transistor is connected to the anode of the first diode in the first diode series. The source terminal and the drain terminal of the first transistor are connected to the input/output terminal and the first voltage source, respectively. The cathode of the second diode is connected to the input/output pad and the anode of the second diode is connected to the second voltage source. The second diode series comprises a plurality of serially connected diodes. The anode of the first diode in the second diode series is connected to the input/output pad. The gate terminal of the second transistor is connected to the anode of the last diode in the second diode series. The substrate of the second transistor is connected to the cathode of the last diode in the second diode series. The source terminal and the drain terminal of the second transistor are connected to the input/output pad and the second voltage source, respectively. The third diode series comprises a plurality of serially connected diodes. The anode of the first diode in the third diode series is connected to the first voltage source. The gate terminal of the third transistor is connected to the anode of the last diode in the third diode series. The substrate of the third transistor is connected to the cathode of the last diode in the third diode series. The source terminal and the drain terminal of the third transistor are connected to the first and the second voltage source, respectively.

The aforementioned double-triggered ESD protection circuit is substrate-triggered as well as gate-triggered so that the triggering voltage is lowered and protective capacity of the ESD protection circuit is enhanced. In the meantime, the protection circuit can be easily incorporated into a circuit chip to deal with any static electricity buildup between an input/output pad and respective power sources $V_{DD}$ and $V_{SS}$.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
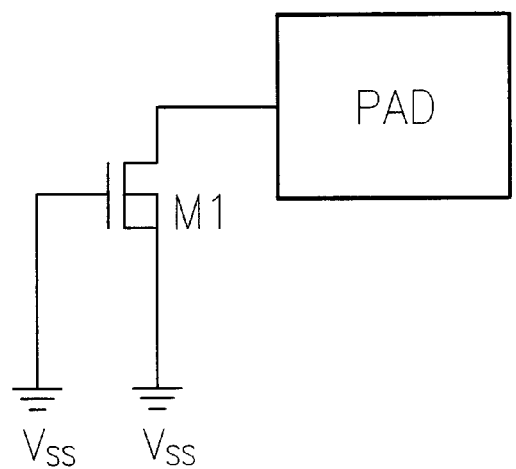
FIG. 1 is a first conventional ESD protection circuit.
Figure 2:
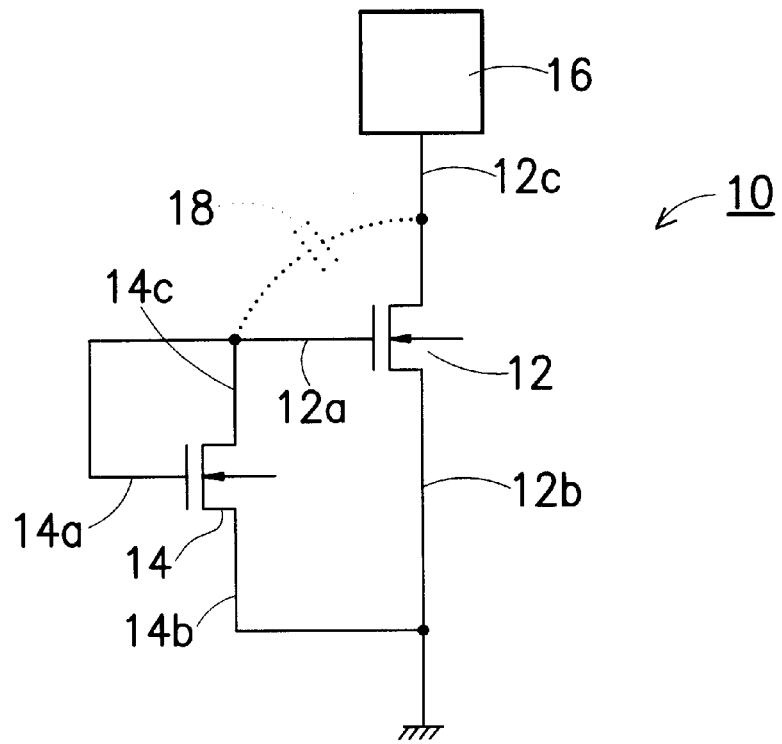
FIG. 2 is a second conventional ESD protection circuit.
Figure 3:
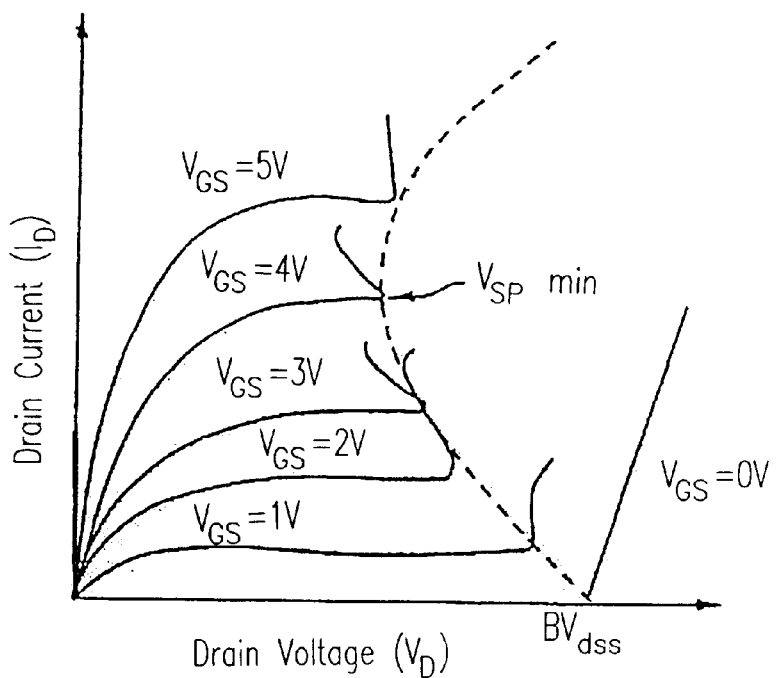
FIG. 3 is a graph showing the breakdown characteristic drain current $I_D$ versus drain voltage $V_D$ under various gate-to-source voltages $V_{GS}$.
Figure 4:
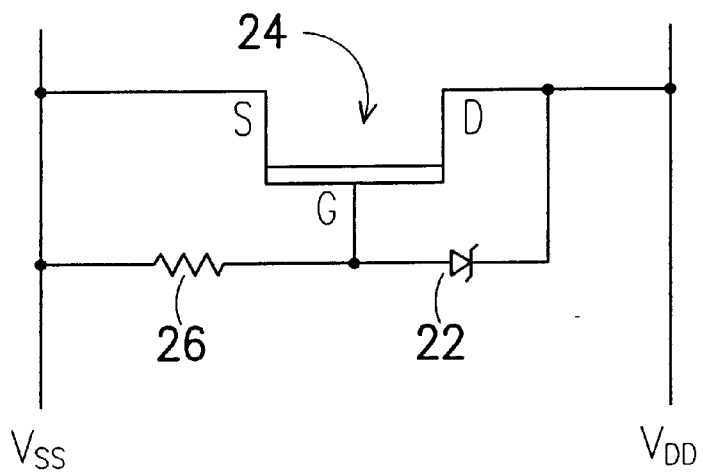
FIG. 4 is a conventional gate-driven ESD protection circuit.
Figure 5:
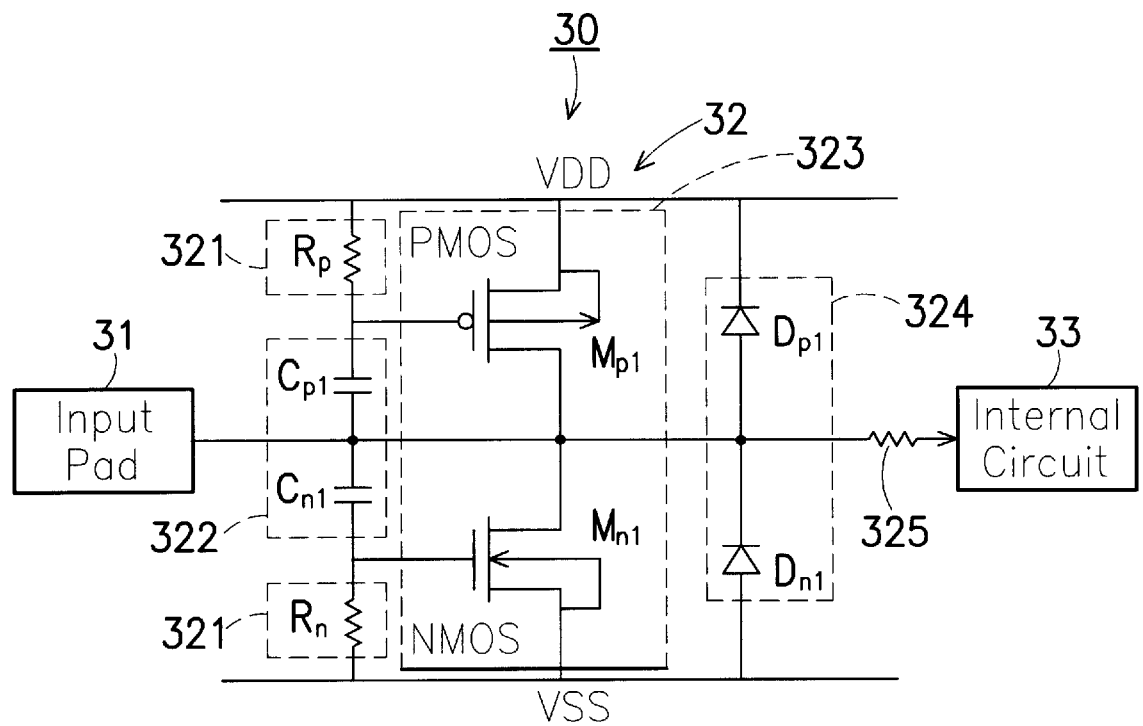
FIG. 5 is a conventional capacitor-coupled ESD protection circuit.
Figure 6:
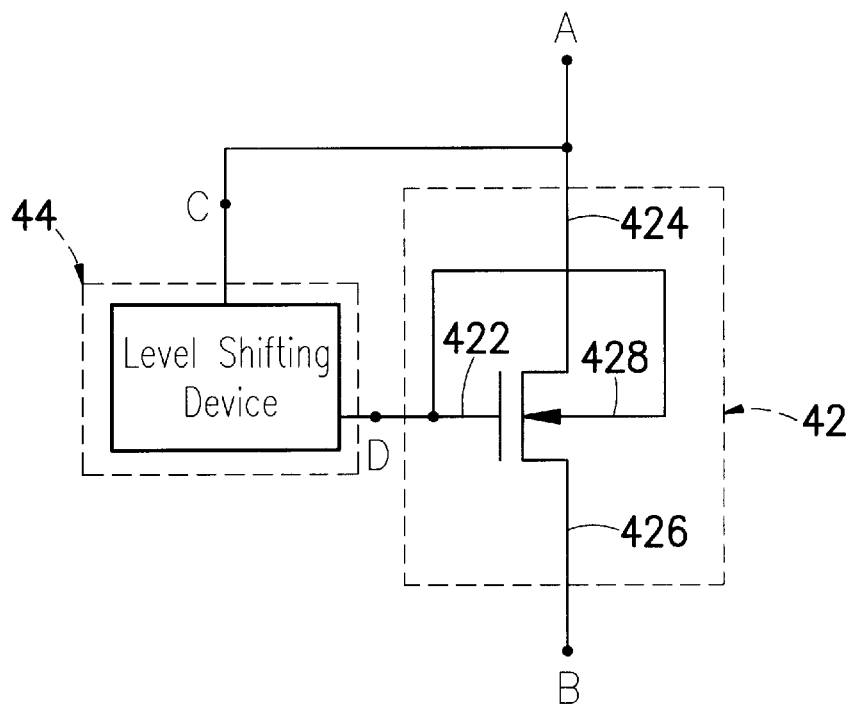
FIG. 6 is a conventional gate-body-coupled ESD protection circuit.

Reference will now be made in detail to the present preferred embodiments of the invention, examples of which are illustrated in the accompanying drawings. Wherever possible, the same reference numbers are used in the drawings and the description to refer to the same or like parts.

Figure 7:
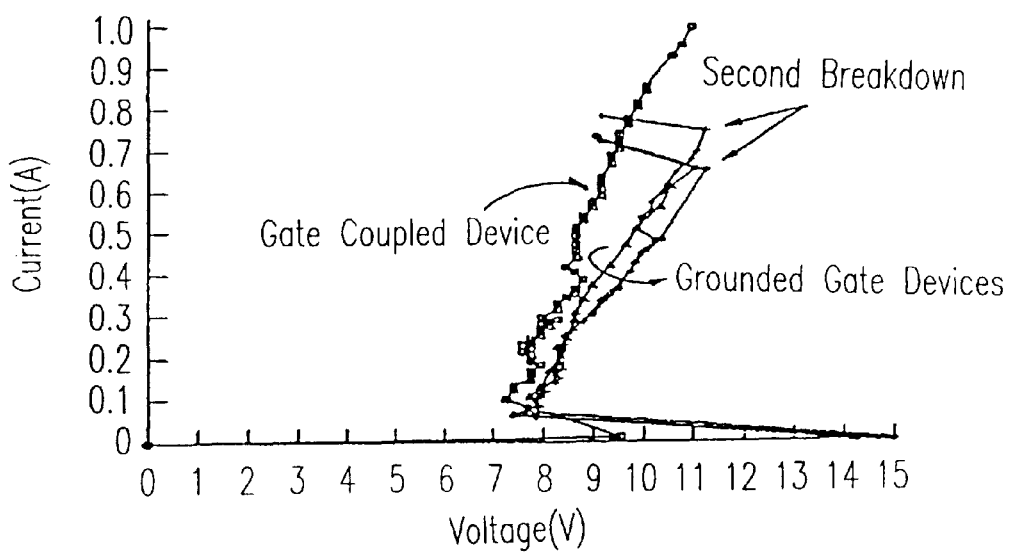
FIG. 7 is a graph showing current the versus voltage relationship of a gate-coupled device.
Figure 8:
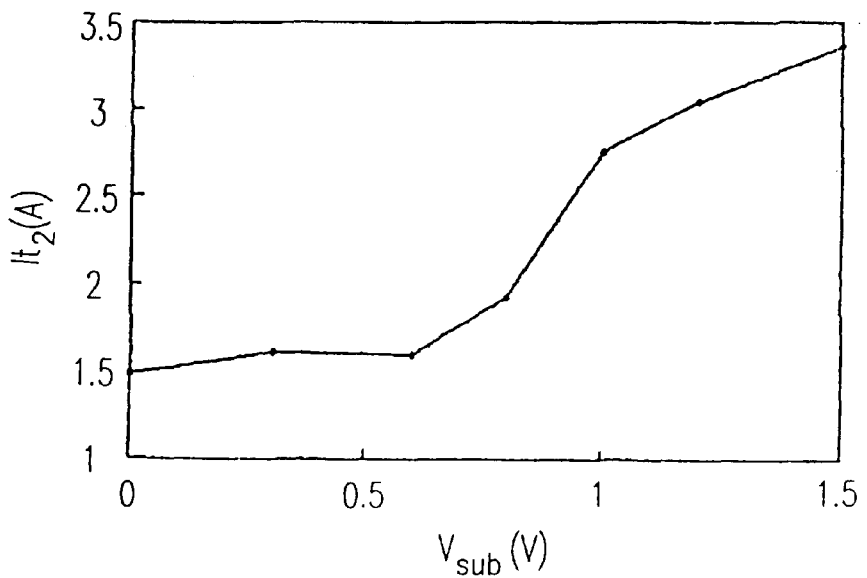
FIG. 8 is a graph showing the substrate voltage $V_{sub}$ versus current $I_{t2}$ relationship.

In recent years, gate-driven design has been developed to improve the protective capacity of an electrostatic discharge (ESD) circuit. A gate-driven protection circuit is able to provide a uniform triggering in the multiple finger devices of a large dimension ESD protective circuit. FIG. 7 is a graph showing the current versus voltage relationship of a gate-coupled device. A detailed explanation of the same can be found in an article by C. Duvvury and C. Diaz, called "Dynamic gate coupling of NMOS for efficient output ESD protection", Pro. of IRPS, pp. 141–150, 1992. In addition, Ker et al. has proposed a substrate-triggered method for lowering the triggering voltage of an ESD device that provides a uniform triggering in the multiple finger devices of a large dimension ESD protective circuit as well as enhanced invincibility. FIG. 8 is a graph showing the substrate voltage $V_{sub}$ versus current $I_{t2}$ relationship of ESD clamp device.

Figure 9:
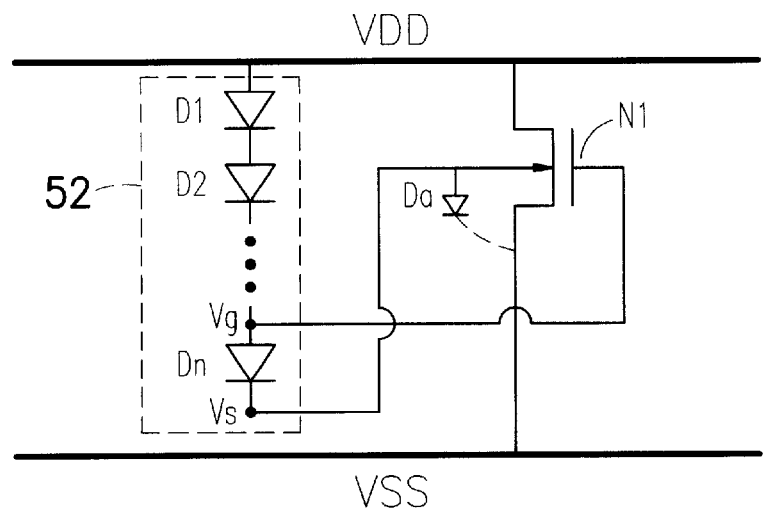
FIG. 9 is a circuit diagram of a double-triggered ESD protection circuit according to a first preferred embodiment of this invention.

FIG. 9 is a circuit diagram of a double-triggered ESD protection circuit according to a first preferred embodiment of this invention. As shown in FIG. 9, a double-triggered electrostatic discharge protection circuit 50 is coupled to a first voltage source $V_{DD}$ and a second voltage source $V_{SS}$. In general, the first voltage source $V_{DD}$ is a relatively high voltage source in an integrated circuit system while the second voltage source $V_{SS}$ is a relatively low voltage source in the integrated circuit. The protection circuit 50 includes a diode series 52 and a transistor N1 (for example, an NMOS transistor). The diode series 52 comprises a plurality of serially connected diodes D1, D2, . . . , Dn. In the diode series 52, the cathode of one diode is connected to the anode of the next following diode. The positive terminal of the first diode D1 in the diode series 52 is connected to the first voltage source $V_{DD}$. The gate terminal of the transistor N1 is connected to the anode of the last diode Dn in the diode series 52. The substrate terminal of the transistor N1 is connected to the cathode of the last diode Dn in the diode series 52. The source terminal and the drain terminal of the transistor N1 are connected to the first voltage source $V_{DD}$ and the second voltage source $V_{SS}$, respectively.

When a positive ESD voltage ($V_{DD}$ to $V_{SS}$) is suddenly applied while the IC circuit is powered down, the N-type double-triggered ESD protection circuit is triggered to discharge the ESD current. The ESD pulse produces a forward bias voltage at the diode series 52 and hence becomes conductive. The ESD current flows through the diode series 52 and arrives at the substrate terminal of the transistor N1. The diode series 52 produces a definite voltage drop along the circuit. The ESD current passes the diode series 52 and the substrate/source junction of the NMOS transistor N1. In the meantime, the forward bias voltage provided by the positive ESD also triggers a parasitic diode Da on the substrate/source junction of the NMOS transistor N1. The node voltage Vg at the anode of the last diode Dn of the diode series 52 is connected to the gate terminal of the NMOS transistor N1. Similarly, the node voltage Vs at the cathode of the last diode Dn of the diode series 52 is connected to the substrate terminal of the NMOS transistor N1.

The voltage Vg applied to the gate terminal of the NMOS transistor N1 triggers the transistor to conduct. According to the circuit configuration shown in FIG. 9, since the anode and the cathode of the last diode Dn in the diode series 52 are connected to the gate terminal and the substrate terminal of the NMOS transistor N1, the gate of the NMOS transistor N1 is triggered before the substrate. When an ESD current is generated, under the condition that the gate-triggering efficiency is higher than substrate-triggering efficiency, voltage applied to the NMOS transistor N1 triggers the gate terminal of the NMOS transistor N1 into a conductive state first.

Through the double-triggering mechanism of this invention, the triggering voltage required to force the NMOS transistor N1 into the snapback region is greatly lowered while the protective capacity of the ESD circuit is increased.

In general, three conductive triggering conditions are produced according to the related magnitude of the voltage applied to the gate and the substrate of the NMOS transistor N1 is related to different positions of the gate and the substrate of the NMOS transistor N in the diode series.

In the first condition, Vg is greater than Vs. In other words, the gate terminal position in the diode series is in the upper portion of the substrate. This means that the voltage applied to the gate terminal of the NMOS transistor N1 is greater than the voltage applied to the substrate terminal of the NMOS transistor N1. The positive ESD voltage triggers the transistor N1 into a conductive state through the gate terminal of the NMOS transistor N1. Thereafter, the positive ESD voltage triggers the parasitic diode Da at the substrate/source junction of the NMOS transistor N1 into a conductive state. In the second condition, Vg is equal to Vs. In other words, the gate terminal and the substrate terminal of the NMOS is located at the same position in the diode series. This means that the voltage applied to the gate terminal of the NMOS transistor N1 is equal to the voltage applied to the substrate terminal of the NMOS transistor N1. Since the gate terminal of the NMOS transistor N1 and the parasitic diode Da on the substrate/source junction of the NMOS transistor N1 are at an identical voltage triggering level, both are triggered into a conductive state. In the third condition, Vg is smaller than Vs. This means that the voltage applied to the gate terminal of the NMOS transistor N1 is smaller than the voltage applied to the substrate terminal of the NMOS transistor N1. Under such a condition, the positive ESD voltage triggers the parasitic diode Da at the substrate/source junction of the NMOS transistor N1 into a conductive state first.

The aforementioned discussion refers to the ESD conditions when the IC circuit is in a power-off state. After the IC circuit is powered on, the voltage source $V_{DD}$ rises from 0V to a definite level ($V_{DD}$). The appearance of the voltage source $V_{DD}$ leads to a voltage transition. Under a voltage transition effect, the conductive voltage of the diode series 52 is about 0.7N volts (N is the number of diodes in the diode series 52). To prevent triggering the ESD protection circuit under normal operating conditions, the conductive voltage 0.7N of the diode series 52 must satisfy the following criteria: (1) the conductive voltage 0.7N of the diode series 52 must be set to a level greater than the voltage source $V_{DD}$; (2) the conductive voltage 0.7N of the diode series 52 must be set to a level smaller than the reverse P-N junction breakdown voltage of the NMOS transistor N1; (3) the voltage Vg must be smaller than the threshold voltage of the NMOS transistor N1; and (4) the substrate voltage of the NMOS transistor N1 must be smaller than the cut-in voltage of the substrate/source junction. Because $V_{GS}<V_{th,n}$, the NMOS transistor remains shut and the voltage at the drain terminal of the transistor N1 remains smaller than the junction avalanche breakdown voltage of the NMOS transistor N1.

Figure 10:
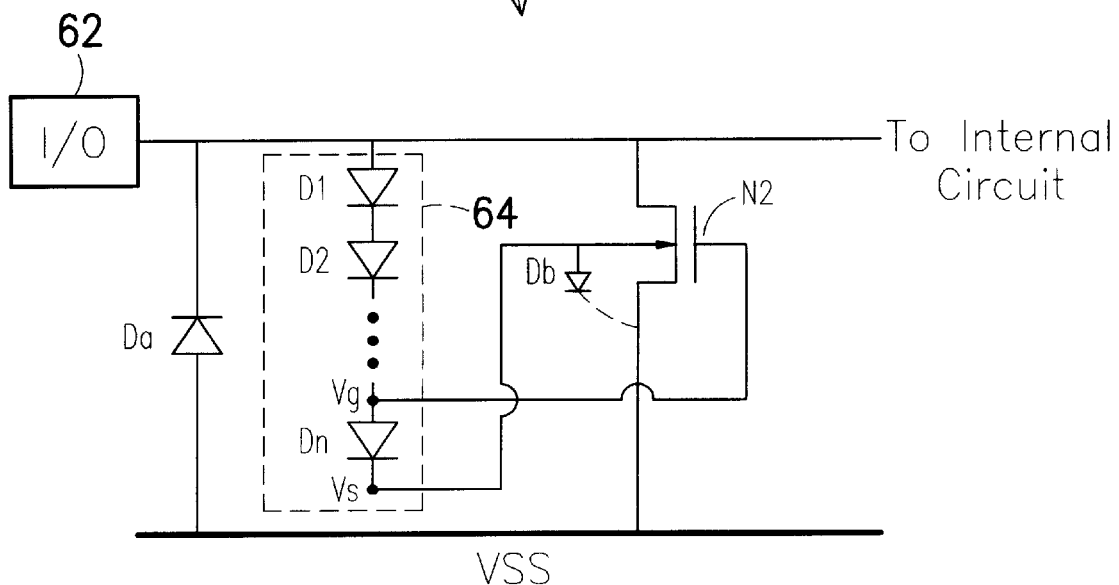
FIG. 10 is a circuit diagram of a double-triggered ESD protection circuit according to a second preferred embodiment of this invention.

FIG. 10 is a circuit diagram of a double-triggered ESD protection circuit according to a second preferred embodiment of this invention. As shown in FIG. 10, a double-triggered electrostatic discharge protection circuit 60 is coupled to an input/output pad 62, a voltage source $V_{SS}$ and an internal circuit. In general, the voltage source $V_{SS}$ is a relatively low voltage source in an integrated circuit. The protection circuit 60 includes a diode Da, a diode series 64 and a transistor N2 (for example, an NMOS transistor). The cathode of the diode Da is connected to the input/output pad 62 while the anode of the diode Da is connected to the voltage source $V_{SS}$. The diode series 64 comprises a plurality of serially connected diodes D1, D2, . . . , Dn. In the diode series 64, the positive terminal of the first diode D1 is connected to the input/output pad 62. The gate terminal of the NMOS transistor N2 is connected to the anode of the last diode Dn of the diode series 64. The substrate of the NMOS transistor N2 is connected to the cathode of the last diode Dn. The source terminal and the drain terminal of the NMOS transistor N2 are connected to the input/output pad 62 and the voltage source $V_{SS}$, respectively.

As shown in FIG. 10, when a positive ESD voltage (relative to $V_{SS}$) is suddenly applied while the IC circuit is powered down, the N-type double-triggered ESD protection circuit is triggered to discharge the ESD current. In other words, the second diode series 64 and the NMOS transistor N2 operate in a manner similar to the one shown in FIG. 9 such that the ESD current is conducted to the voltage source $V_{SS}$. Since the procedure has been described before, a detailed explanation is not repeated here.

On the other hand, when a negative ESD voltage (relative to $V_{SS}$) is suddenly applied while the IC circuit is powered down, the ESD voltage forces the diode Da to open. The ESD current is led to the voltage source $V_{SS}$ instead of going to the internal circuit.

Figure 11:
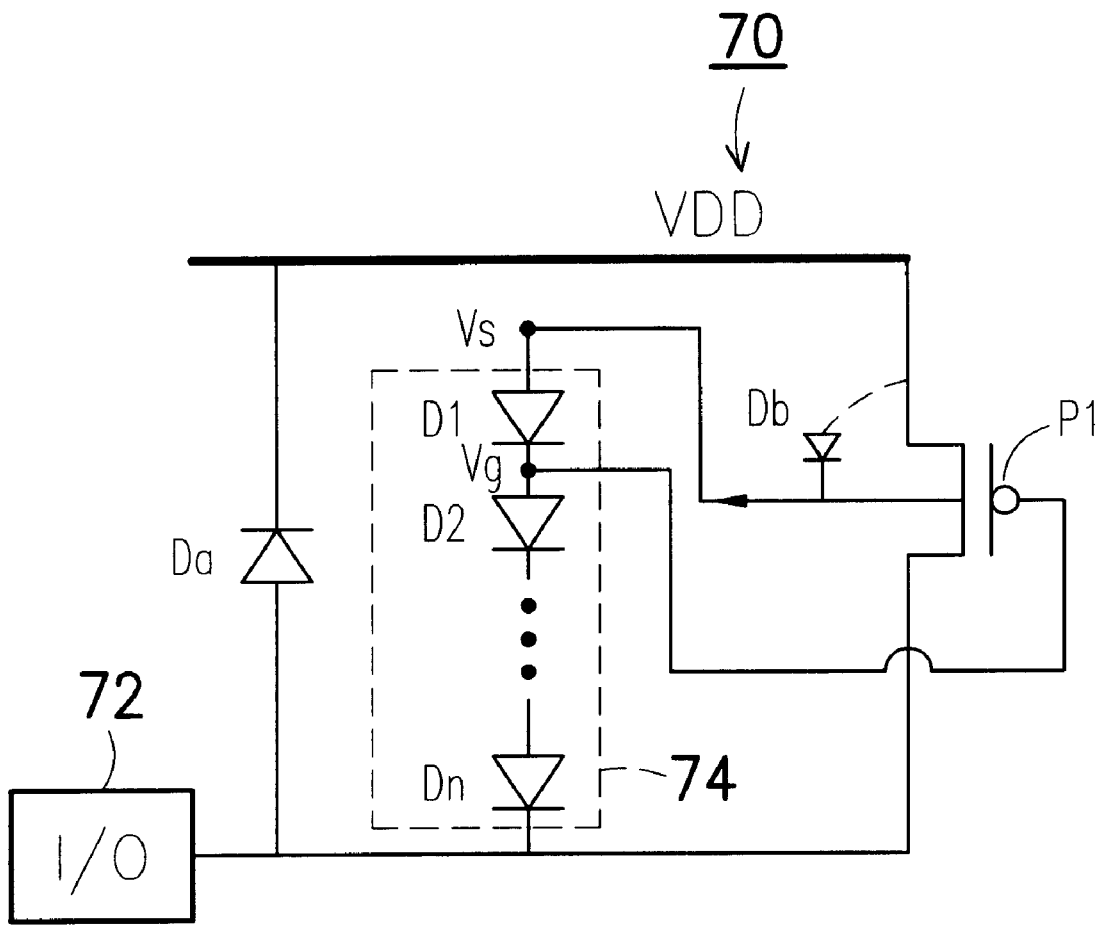
FIG. 11 is a circuit diagram of a double-triggered ESD protection circuit according to a third preferred embodiment of this invention.

FIG. 11 is a circuit diagram of a double-triggered ESD protection circuit according to a third preferred embodiment of this invention. As shown in FIG. 11, a double-triggered electrostatic discharge protection circuit 70 is coupled to an input/output pad 72, a voltage source $V_{DD}$ and an internal circuit. In general, the voltage source $V_{DD}$ is a relatively high voltage source in an integrated circuit system. The protection circuit 70 includes a diode Da, a diode series 74 and a transistor P1 (for example, a PMOS transistor). The anode of the diode Da is connected to the input/output pad 72 while the cathode of the diode Da is connected to the voltage source $V_{DD}$. The diode series 74 comprises a plurality of serially connected diodes D1, D2, . . . , Dn. In the diode series 74, the cathode of the last diode Dn is connected to the input/output pad 72. The gate terminal of the transistor P1 is connected to the cathode of the first diode D1 in the diode series 74. The substrate terminal of the transistor P1 is connected to the anode of the first diode D1 in the diode series 74. The source terminal and the drain terminal of the transistor P1 are connected to the input/output pad 72 and the voltage source $V_{DD}$, respectively.

As shown in FIG. 11, when a negative ESD voltage ($V_{DD}$ to $V_{SS}$) is suddenly applied while the IC circuit is powered down, the P-type double-triggered ESD protection circuit is triggered to discharge the ESD current. The ESD pulse produces a forward bias voltage at the diode series 74 and hence becomes conductive. The ESD current flows through the diode series 74 and arrives at the substrate terminal of the PMOS transistor P1. The diode series 74 produces a definite voltage drop along the circuit. The ESD current passes the diode series 74 and the substrate/source junction of the PMOS transistor P1. In the meantime, the forward bias voltage provided by the negative ESD also triggers a parasitic diode Db on the substrate/source junction of the already conductive PMOS transistor P1. As shown in FIG. 11, the node voltage Vg at the cathode of the first diode D1 of the diode series 74 is connected to the gate terminal of the PMOS transistor P1. Similarly, the node voltage Vs at the anode of the first diode D1 of the diode series 74 is connected to the substrate terminal of the PMOS transistor P1.

The voltage Vg applied to the gate terminal of the PMOS transistor P1 triggers the transistor P1 to conduct. According to the circuit configuration shown in FIG. 11, since the cathode and the anode of the first diode D1 in the diode series 74 are connected to the gate terminal and the substrate terminal of the PMOS transistor P1, the gate of the PMOS transistor P1 is triggered before the substrate. When an ESD current is generated, under the condition that the gate-triggering efficiency is higher than substrate-triggering efficiency, voltage applied to the PMOS transistor P1 triggers the gate terminal of the PMOS transistor P1 into a conductive state first.

Through the double-triggering mechanism of this invention, the triggering voltage required to force the PMOS transistor P1 into the snapback region is greatly lowered while the protective capacity of the ESD circuit is increased. In general, three conductive triggering conditions are produced according to the related magnitude of the voltage applied to the gate and the substrate of the PMOS transistor P1 is related to the different positions of the gate and the substrate of the PMOS transistor P1 in the diode series.

First, if |Vg| is greater than |Vs|, the voltage applied to the gate terminal of the PMOS transistor P1 is greater than the voltage applied to the substrate terminal of the PMOS transistor P1. The negative ESD voltage triggers the transistor P1 into a conductive state through the gate terminal of the PMOS transistor P1. Thereafter, the negative ESD voltage triggers the parasitic diode Db at the substrate/source junction of the PMOS transistor P1 into a conductive state.

If |Vg| is equal to |Vs|, the voltage applied to the gate terminal of the PMOS transistor P1 is equal to the voltage applied to the substrate terminal of the PMOS transistor P1. Since the gate terminal of the PMOS transistor P1 and the parasitic diode Db on the substrate/source junction of the PMOS transistor P1 are at an identical voltage triggering level, both are triggered into a conductive state.

If |Vg| is smaller than |Vs|, the voltage applied to the gate terminal of the PMOS transistor P1 is smaller than the voltage applied to the substrate terminal of the PMOS transistor P1. Under such condition, the negative ESD voltage triggers the parasitic diode Db at the substrate/source junction of the PMOS transistor P1 into a conductive state first.

The aforementioned discussion refers to the ESD conditions when the IC circuit is in a power-off state. After the IC circuit is powered on, the voltage source $V_{DD}$ rises from 0V to a definite level ($V_{DD}$). The appearance of the voltage source $V_{DD}$ leads to a voltage transition. Under a voltage transition effect, the conductive voltage of the diode series 74 is about |0.7N| volts (N is the number of diodes in the diode series 74). To prevent triggering the ESD protection circuit under normal operating conditions, the conductive voltage 0.7N of the diode series 74 must satisfy the following criteria: (1) the conductive voltage |0.7N| of the diode series 74 must be set to a level greater than the voltage source $V_{DD}$; (2) the conductive voltage |0.7N| of the diode series 74 must be set to a level smaller than the reverse P-N junction breakdown voltage of the PMOS transistor P1; (3) the voltage Vg must be smaller than the threshold voltage of the PMOS transistor P1; and (4) the substrate voltage of the PMOS transistor P1 must be smaller than the cut-in voltage of the substrate/source junction. Because $V_{GS}<V_{th,p}$, the PMOS transistor remains shut and the voltage at the drain terminal of the transistor P1 remains smaller than the junction avalanche breakdown voltage of the PMOS transistor P1.

Figure 12:
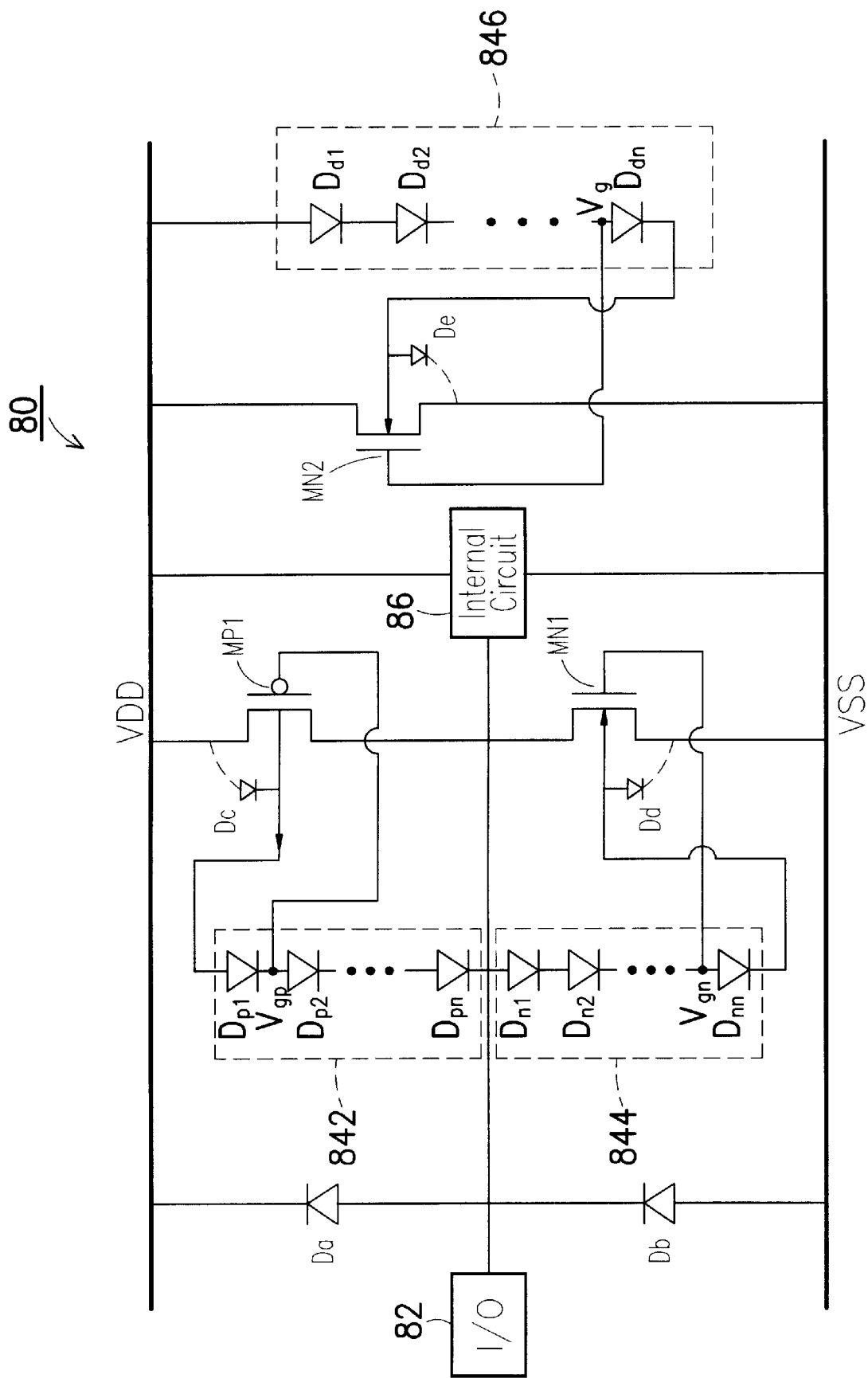
FIG. 12 is a circuit diagram of a double-triggered ESD protection circuit according to a fourth preferred embodiment of this invention.

FIG. 12 is a circuit diagram of a double-triggered ESD protection circuit according to a fourth preferred embodiment of this invention. The double-triggered ESD protection circuit 80 is formed by integrating the three circuits described in FIGS. 9, 10 and 11. The protection circuit 80 is connected to an input/output pad, a first voltage source $V_{DD}$, a second voltage source $V_{SS}$ and an internal circuitry 86. In general, $V_{DD}$ is a high voltage source of an integrated circuit system while $V_{SS}$ is a low voltage source of the integrated circuit system.

As shown in FIG. 12, the double-triggered ESD protection circuit 80 includes a first diode Da, a first diode series 842, a first transistor MP1 (PMOS), a second diode Db, a second diode series 844, a second transistor MN1 (NMOS), a third diode series 846 and a third transistor MN2 (NMOS). The anode of the first diode Da is connected to the input/output pad 82 and the cathode of the first diode Da is connected to the first voltage source $V_{DD}$. The first diode series 842 includes a plurality of serially connected diodes Dp1, Dp2, ..., Dpn. The anode of the last diode Dpn in the diode series 842 is connected to the input/output pad 82. The gate terminal of the first transistor MP1 is connected to the cathode of the first diode Dp1 in the diode series 842. The substrate of the transistor MP1 is connected to the anode of the first diode Dp1 in the diode series 842. The source terminal and the drain terminal of the transistor MP1 are connected to the first voltage source $V_{DD}$ and the input/output pad 82, respectively. The cathode of the second diode Db is connected to the input/output pad 82 and the anode of the second diode Db is connected to the second voltage source $V_{SS}$. The second diode series 844 includes a plurality of serially connected diodes Dn1, Dn2, ..., Dnn. The anode of the first diode Dp1 in the diode series 844 is connected to the input/output pad 82. The gate terminal of the second transistor MN1 is connected to the anode of the last diode Dnn of the second diode series 844. The substrate of the transistor MN1 is connected to the cathode of the last diode Dnn of the second diode series 844. The source and drain terminal of the transistor MN1 are connected to the second voltage source $V_{SS}$ and the input/output pad 82, respectively. The third diode series 846 includes a plurality of serially connected diodes Dd1, Dd2, ..., Ddn. The anode of the first diode Dd1 in the diode series 846 is connected to the first voltage source $V_{DD}$. The gate terminal of the third transistor MN2 is connected to the anode of the last diode Ddn in the third diode series 846. The substrate of the third transistor MN2 is connected to the cathode of the last diode Ddn in the third diode series 846. The source and the drain terminal of the third transistor MN2 are connected to the first voltage source $V_{DD}$ and the second voltage source $V_{SS}$, respectively.

The procedures for operating various sub-circuits in FIG. 12 under various operating conditions have been separately described in FIGS. 9, 10 and 11. Hence, a detailed explanation of the double-triggered ESD protection circuit in FIG. 12 is not repeated here.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A double-triggered electrostatic discharge (ESD) protection circuit for coupling with a first voltage source and a second voltage source, the ESD circuit comprising:

a diode series constructed from a plurality of serially connected diodes, wherein a positive terminal of the first diode in the diode series is connected to the first voltage source; and a transistor, wherein a gate terminal of the transistor is connected to an anode of a last diode in the diode series, a substrate terminal of the transistor is connected to a cathode of the last diode in the diode series, and a drain terminal and a source terminal of the transistor are connected to the first voltage source and the second voltage source, respectively.

2. The ESD protection circuit of claim 1, wherein the first voltage source is at a voltage level higher than that of the second voltage source.

3. The ESD protection circuit of claim 1, wherein the circuit further includes a parasitic diode coupled to the substrate terminal and the source terminal of the transistor.

4. The ESD protection circuit of claim 1, wherein the transistor includes an NMOS transistor.

5. The ESD protection circuit of claim 1, wherein a conducting voltage of the diode series is higher than a voltage provided by the first voltage source.

6. The ESD protection circuit of claim 5, wherein the conducting voltage of the diode series is smaller than a reverse P-N junction breakdown voltage of the transistor.

7. The ESD protection circuit of claim 5, wherein voltage at the anode of the last diode in the diode series is smaller than a threshold voltage of the transistor.

8. The ESD protection circuit of claim 5, wherein a substrate voltage of the transistor is smaller than a cut-in voltage of the substrate/source junction of the transistor.

9. A double-triggered electrostatic discharge (ESD) protection circuit for coupling with an input/output pad, a voltage source and an internal circuit, the ESD circuit comprising:

a diode, wherein a cathode of the diode is connected to the input/output pad and an anode of the diode is connected to the voltage source;

a diode series constructed from a plurality of serially connected diodes, wherein a positive terminal of a first diode in the diode series is connected to the input/output pad; and a transistor, wherein a gate terminal of the transistor is connected to an anode of the last diode in the diode series, a substrate of the transistor is connected to a cathode of the last diode in the diode series, and a source terminal and a drain terminal of the transistor are connected to the voltage source and the input/output pad, respectively.

10. The ESD protection circuit of claim 9, wherein the circuit further includes a parasitic diode connected to a substrate terminal and the source terminal of the transistor.

11. The ESD protection circuit of claim 9, wherein the transistor includes an NMOS transistor.

12. The ESD protection circuit of claim 9, wherein a conducting voltage of the diode series is greater than the voltage source.

13. The ESD protection circuit of claim 12, wherein the conducting voltage of the diode series is smaller than the reverse P-N junction breakdown voltage of the transistor.

14. The ESD protection circuit of claim 12, wherein voltage at the anode of the last diode in the diode series is smaller than a threshold voltage of the transistor.

15. The ESD protection circuit of claim 12, wherein a substrate voltage of the transistor is smaller than a cut-in voltage of a substrate/source junction of the transistor.

16. A double-triggered electrostatic discharge (ESD) protection circuit for coupling with an input/output pad, a voltage source and an internal circuit, the ESD circuit comprising:

a diode, wherein an anode of the diode is connected to the input/output pad and a cathode of the diode is connected to the voltage source;

a diode series constructed from a plurality of serially connected diodes, wherein a cathode of a last diode in the diode series is connected to the input/output pad; and a transistor, wherein a gate terminal of the transistor is connected to a cathode of a first diode in the diode series, a substrate of the transistor is connected to an anode of the first diode in the diode series, and a source terminal and a drain terminal of the transistor are connected to the voltage source and the input/output pad, respectively.

17. The ESD protection circuit of claim 16, wherein the circuit further includes a parasitic diode connected to a substrate terminal and the source terminal of the transistor.

18. The ESD protection circuit of claim 16, wherein the transistor includes a PMOS transistor.

19. The ESD protection circuit of claim 16, wherein an absolute value of the conductive voltage of the diode series is greater than the voltage source.

20. The ESD protection circuit of claim 19, wherein the absolute value of the conducting voltage of the diode series is smaller than a reverse P-N junction breakdown voltage of the transistor.

21. The ESD protection circuit of claim 19, wherein an absolute value of a voltage at the anode of the diode series is smaller than a threshold voltage of the transistor.

22. The ESD protection circuit of claim 19, wherein a substrate voltage of the transistor is smaller than a cut-in voltage of a substrate/source junction of the transistor.

23. A double-triggered electrostatic discharge (ESD) protection circuit for coupling with an input/output pad, a first voltage source and a second voltage source, the ESD circuit comprising:

a first diode, wherein an anode of the first diode is connected to the input/output pad and a cathode of the first diode is connected to the first voltage source;

a first diode series constructed from a plurality of serially connected diodes, wherein a cathode of a last diode in the first diode series is connected to the input/output pad;

a first transistor, wherein a gate terminal of the first transistor is connected to a cathode of a first diode in the first diode series, a substrate of the first transistor is connected to an anode of the first diode in the first diode series, and a source terminal and a drain terminal of the first transistor are connected to the first voltage source and the input/output pad, respectively;

a second diode, wherein a cathode of the second diode is connected to the input/output pad and a cathode of the second diode is connected to the second voltage source;

a second diode series constructed from a plurality of serially connected diodes, wherein an anode of a last diode in the second diode series is connected to the input/output pad;

a second transistor, wherein a gate terminal of the second transistor is connected to the anode of the last diode in the second diode series, the substrate of the second transistor is connected to a cathode of the last diode in the second diode series, and the source terminal and the drain terminal of the second transistor are connected to the second voltage source and the input/output pad, respectively;

a third diode series constructed from a plurality of serially connected diodes, wherein an anode of a first diode in the third diode series is connected to the first voltage source; and a third transistor, wherein a gate terminal of the third transistor is connected to the anode of the last diode in the third diode series, the substrate of the third transistor is connected to a cathode of a last diode in the third diode series, and a source terminal and a drain terminal of the third transistor are connected to the first voltage source and the second voltage source, respectively.

24. The ESD protection circuit of claim 23, wherein the circuit further includes first, second and third parasitic diodes coupled to the substrate and the source of the first, second and third transistors, respectively.

25. The ESD protection circuit of claim 23, wherein the first transistor is a PMOS transistor and the second and third transistors are NMOS transistors.

* * * * *